(12) United States Patent
Jung

(10) Patent No.: US 8,345,471 B2
(45) Date of Patent: Jan. 1, 2013

(54) MAGNETO-RESISTANCE ELEMENT AND SEMICONDUCTOR MEMORY DEVICE INCLUDING THE SAME

(75) Inventor: Ha Chang Jung, Icheon-si (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 168 days.

(21) Appl. No.: 12/899,843

(22) Filed: Oct. 7, 2010

(65) Prior Publication Data

US 2012/0087179 A1  Apr. 12, 2012

(51) Int. Cl.
*G11C 11/00* (2006.01)
(52) U.S. Cl. .................. 365/158; 365/171; 365/173
(58) Field of Classification Search .......... 365/158, 365/171, 173
See application file for complete search history.

(56) References Cited

U.S. PATENT DOCUMENTS

| 6,608,738 | B2 * | 8/2003 | Sakakima et al. | 360/324.11 |
| 6,876,523 | B2 * | 4/2005 | Takahashi et al. | 360/324.11 |
| 7,098,495 | B2 * | 8/2006 | Sun et al. | 257/295 |
| 7,221,545 | B2 * | 5/2007 | Gill | 360/324.11 |
| 8,119,018 | B2 * | 2/2012 | Ikemoto et al. | 216/22 |
| 2011/0141796 | A1 * | 6/2011 | Lee et al. | 365/158 |

FOREIGN PATENT DOCUMENTS

| KR | 1020040078673 | 9/2004 |
| KR | 1020050036985 | 4/2005 |
| KR | 100841280 | 6/2008 |

* cited by examiner

*Primary Examiner* — Pho M Luu
(74) *Attorney, Agent, or Firm* — IP & T Group LLP

(57) ABSTRACT

A magneto-resistance element is provided. The magneto-resistance element includes an underlying layer including a main metal selected from electrically conductive metals and an auxiliary metal selected from transition metals, a first magnetic layer stacked on the underlying layer, an insulation layer stacked on the first magnetic layer, and a second magnetic layer stacked on the insulation layer.

21 Claims, 2 Drawing Sheets

MAGNETO-RESISTANCE ELEMENT AND SEMICONDUCTOR MEMORY DEVICE INCLUDING THE SAME

BACKGROUND OF THE INVENTION

Exemplary embodiments of the present invention relate to a semiconductor device, and more particularly, to a magneto-resistance element using a magneto-resistance change.

A dynamic random access memory (DRAM) is a representative memory device which has been widely used. A DRAM is advantageous in that it can operate at a high speed and can be highly integrated. However, a DRAM is a volatile memory which loses data when power is interrupted, and thus, requires a refresh operation to rewrite data upon its operation. Hence, a DRAM is disadvantageous in terms of power loss in comparison to non-volatile memory. Also, a flash memory with nonvolatility and high integration characteristics is disadvantageous in that its operating speed is low. In this regard, a magnetic random access memory (MRAM) which stores data using a magneto-resistance change is advantageous in that it has nonvolatility, can have high speed operation characteristics, and can be highly integrated.

More specifically, MRAM refers to a nonvolatile memory device which uses a magneto-resistance change according to a magnetization direction between ferromagnetic materials. Exemplary cell structures, which are widely adopted as an MRAM, include a giant magneto-resistance (GMR) element using a GMR effect, a magnetic tunnel junction (MTJ) element using a tunnel magneto-resistance (TMR) effect, a spin-valve element, and so on. To overcome the disadvantage of the GMR element, the spin-valve element reinforces a ferromagnetic layer with a permanent magnet and adopts a free layer as a soft magnetic layer. In particular, the MTJ element has high speed and low power characteristics. The MTJ element may be used as a substitute for a capacitor of a DRAM and is applicable in a low power device, a high speed graphic device, or a mobile device.

In general, a magneto-resistance element has a relatively small resistance when spin directions (magnetic momentum directions) of two magnetic layers are equal to each other, and has a relatively large resistance when spin directions (magnetic momentum directions) of two magnetic layers are opposite to each other. As such, bit data can be written to an MRAM by using the fact that the resistance of the cell changes depending on the magnetization state of the magnetic layers. An MRAM having an MTJ structure is exemplarily described below. In an MTJ memory cell, having a ferromagnetic layer—insulation layer—ferromagnetic layer stacked structure, when electrons tunneling through the first ferromagnetic layer pass through the insulation layer, used as a tunneling barrier, the tunneling probability changes depending on the magnetization direction of the second ferromagnetic layer. That is, the tunneling probability is highest when the magnetization directions of the two ferromagnetic layers are parallel to each other, and is lowest when the magnetization directions of the two ferromagnetic layers are anti-parallel to each other. For example, it can be considered that data '1' (or '0') is written when a resistance is relatively large, and data '0' (or '1') is written when a resistance is relatively small. One of the two ferromagnetic layers is referred to as a pinned magnetic layer, whose magnetization direction is pinned, and the other is referred to as a free magnetic layer, whose magnetization direction is reversed by an external magnetic field or electric current.

Meanwhile, in order to utilize magneto-resistance elements in practical applications, in particular, in order to apply magneto-resistance elements to memory devices, a difference in electrical conductivity must be great between a first case in which the electron spin direction of the pinned magnetic layer and the electron spin direction of the free magnetic layer are equal and a second case in which they are opposite to each other. Specifically, when electric current flows through a thin insulation layer between the pinned magnetic layer and the free magnetic layer, a magneto-resistance ratio between the first and second cases should be highly disproportional. In order to obtain a highly disproportional magneto-resistance ratio, a surface roughness of an interface between the pinned magnetic layer and the insulation layer and a surface roughness of an interface between the free magnetic layer and the insulation layer must be improved. In general, the surface roughness of these interfaces may be improved through a thermal treatment, but the magnetic layers may be demagnetized at high temperature.

SUMMARY OF THE INVENTION

Exemplary embodiments of the present invention are directed to a magneto-resistance element which improves a magneto-resistance ratio by suppressing electron scattering at an interface between a pinned magnetic layer or a free magnetic layer and an insulation layer.

Exemplary embodiments of the present invention are also directed to improving the reliability of an MRAM.

In accordance with an exemplary embodiment of the present invention, a magneto-resistance element includes an underlying layer including a main metal selected from electrically conductive metals and an auxiliary metal selected from transition metals a first magnetic layer stacked on the underlying layer, an insulation layer stacked on the first magnetic layer, and a second magnetic layer stacked on the insulation layer.

The first and second magnetic layers may be ferromagnetic layers including at least one material selected from the group consisting of NiFe, Co, Fe, Ni, CoFe, CoFeB, and CoFeSiB.

The insulation layer may include at least one material selected from the group consisting of TiO, CuO, NiO, CoO, MgO, TiAlO, ZrAlO, HfO2, AlO, Ga2O3, TaO, EuO, EuS, Fe2O3, and ZrO. In addition, the insulation layer may have a lower electrical conductivity than the first and second magnetic layers. Furthermore, the insulation layer may include an oxygen-containing metallic or nonmetallic compound.

The first magnetic layer may be a synthetic anti-ferromagnet (SAF) layer, which includes two ferromagnetic layers and a non-magnetic layer disposed between the two ferromagnetic layers.

The magneto-resistance element may further include an anti-ferromagnetic layer disposed between the underlying layer and the first magnetic layer.

The anti-ferromagnetic layer may include at least one material selected from the group consisting of MnFe, MnIr, MnRh, PtMn, and Ru.

The auxiliary metal may have a smaller atomic size than the main metal. Also, the auxiliary metal may have an atomic percent of 50% or less with respect to the main metal. The main metal may include at least one material selected from the group consisting of Al, Cu, and W, and the auxiliary metal may include at least one material selected from the group consisting of Ti, Fe, Co, Zr, Nb, Ni, Ru, Ag, Ta, Pt, and Au.

In accordance with another exemplary embodiment of the present invention, an MRAM includes a memory cell configured with a magnetic tunnel junction (MTJ) element and a selection transistor, wherein the MTJ element includes an underlying layer including a main metal selected from electrically conductive metals and an auxiliary metal selected from transition metals, a first magnetic layer stacked on the underlying layer, an insulation layer stacked on the first magnetic layer, and a second magnetic layer stacked on the insulation layer. The auxiliary metal may have a smaller atomic size than the main metal. The auxiliary metal may have an atomic percent of 50% or less with respect to the main metal. The main metal may include at least one material selected from the group consisting of Al, Cu, and W, and the auxiliary metal may include at least one material selected from the group consisting of Ti, Fe, Co, Zr, Ni, Nb, Rh, Ag, Ta, Pt, and Au.

In accordance with yet another exemplary embodiment of the present invention, a method of fabricating a magneto-resistance element is provided, the method including forming an underlying layer including an alloy, forming a first magnetic layer stacked on the underlying layer, forming an insulation layer stacked on the first magnetic layer, and forming a second magnetic layer stacked on the insulation layer.

More specifically, the alloy may include a main metal selected from electrically conductive metals and an auxiliary metal selected from transition metals.

DESCRIPTION OF SPECIFIC EMBODIMENTS

Figure 1:
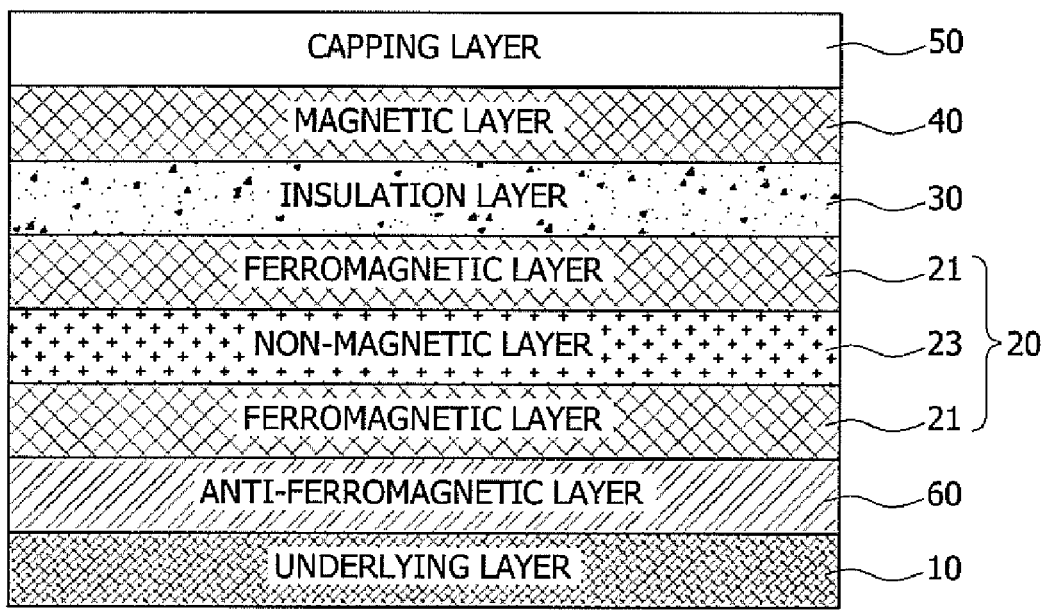
FIG. 1 is a cross-sectional view of a magneto-resistance element in accordance with an exemplary embodiment of the present invention.

Exemplary embodiments of the present invention will be described below in more detail with reference to the accompanying drawings. The present invention may, however, be embodied in different forms and should not be constructed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Herein, use of the word "on," as in "a first layer is on a second layer," may be refer to a case in which a first layer is directly over a second layer without any layer in-between or a case in which one or more layers are between the first and second layers.

A magneto-resistance element in accordance with an exemplary embodiment of the present invention will be described below with reference to FIG. 1. For reference, FIG. 1 illustrates a cross-sectional structure of a magneto-resistance element in accordance with an exemplary embodiment of the present invention. As illustrated in FIG. 1, an underlying layer 10 is disposed at the bottom. A first magnetic layer 20 serving as a pinned magnetic layer, an insulation layer 30 serving as a tunnel barrier layer, and a second magnetic layer 40 serving as a free magnetic layer are sequentially stacked on the underlying layer 10. In addition, an anti-ferromagnetic layer 60 may be provided between the underlying layer 10 and the first magnetic layer 20, and an electrically conductive capping layer 50 may be further provided on the second magnetic layer 40.

The first and second magnetic layers 20 and 40 may be provided with ferromagnetic layers including at least one material selected from the group consisting of NiFe, Co, Fe, Ni, CoFe, CoFeB, and CoFeSiB. In particular, the first magnetic layer 20 may be a monolayer ferromagnetic layer. As illustrated in FIG. 1, the first magnetic layer 20 may be a synthetic anti-ferromagnet (SAF) layer, which includes two ferromagnetic layers 21 and a non-magnetic layer 23 (e.g., an Ru layer) disposed between the two ferromagnetic layers 21. When such a synthetic anti-ferromagnet layer is used as the first magnetic layer 20, it prevents the magnetization reversal of an anti-parallel field generated by the two ferromagnetic layers 21 at the boundaries of the non-magnetic layer 23. Also, in an area in which the second magnetic layer 40 is reversely magnetized, there exists a current density or magnetic field area in which the first magnetic layer 20 is not reversely magnetized. Therefore, even though the second magnetic layer 40 is reversely magnetized, the first magnetic layer 20 may not be reversely magnetized.

Meanwhile, in order to allow the first magnetic layer 20 to securely exhibit a function of a pinned magnetic layer, that is, in order to suppress the reverse magnetization of the first magnetic layer 20, the anti-ferromagnetic layer 60 may be provided between the underlying layer 10 and the first magnetic layer 20. Due to the anti-ferromagnetic layer 60, an area for a magnetic field or a critical current density necessary for the magnetization reversal of the first magnetic layer 20 is completely separated from the second magnetic layer 40. Thus, the first magnetic layer 20 is not reversely magnetized and only the second magnetic layer 40 is reversely magnetized in the external magnetic field or electric current area corresponding to an actual use range. The anti-ferromagnetic layer 60 may be formed of at least one material selected from the group consisting of MnFe, MnIr, MnRh, PtMn, and Ru.

Furthermore, the insulation layer 30 may be formed of an oxygen-containing metallic or nonmetallic compound. Specifically, the insulation layer 30 may be formed of at least one material selected from the group consisting of TiO, CuO, NiO, CoO, MgO, TiAlO, ZrAlO, HfO$_2$, AlO, Ga$_2$O$_3$, TaO, EuO, EuS, Fe$_2$O$_3$, and ZrO. Moreover, the insulation layer 30 may have a lower electrical conductivity than the first and second magnetic layers 20 and 40.

The first magnetic layer 20, the insulation layer 30, and the second magnetic layer 40, together constituting the magneto-resistance element, are stacked on the underlying layer 10. In this exemplary embodiment, the underlying layer 10 is formed of an alloy, including a main metal, selected from electrically conductive metals, and an auxiliary metal, selected from transition metals. Conventionally, the underlying layer has been formed of only a metallic material having a high electrical conductivity. However, in this exemplary embodiment, the underlying layer 10 is formed of an alloy, including a main metal selected from the electrically conductive metals and an auxiliary metal selected from the transition metals. Specifically, the main metal may be selected from the group consisting of Al, Cu, and W, and the auxiliary metal may be selected from the group consisting of Ti, Fe, Co, Zr, Ni, Nb, Ru, Ag, Ta, Pt, and Au. Also, the auxiliary metal may have a smaller atomic size than the main metal in order to allow the auxiliary metal to fit into an interstitial site of the main metal crystal and suppress the grain growth of the main metal. Also, the auxiliary metal may be included at the atomic percent of 50% or less with respect to the main metal.

Figure 2:
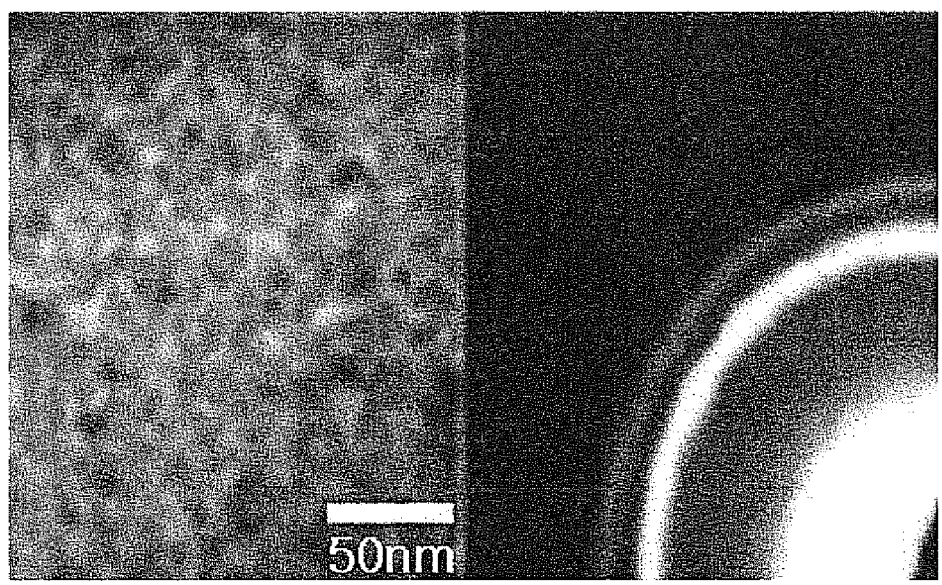
FIG. 2 is a transmission electron microscopy (TEM) image of an underlying layer formed of an alloy, including titanium (Ti), serving as an auxiliary metal, at an atomic percent of approximately 6% with respect to aluminum (Al), serving as a main metal.

In this exemplary embodiment, the underlying layer 10 may be formed of an alloy, including the main metal and the auxiliary metal. Accordingly, the surface roughness of the underlying layer 10 may be remarkably improved. FIG. 2 is a TEM image of an alloy in which Ti, serving as the auxiliary metal, is added at an atomic percent of approximately 6% with respect to Al, serving as the main metal. As can be seen from FIG. 2, the underlying layer 10 formed of an Al—Ti alloy has a very fine grain. This is because Ti atoms added as the auxiliary metal suppress the grain growth of Al. When the surface roughness of the underlying layer 10 is improved, the surface roughness of other layers stacked on the underlying layer 10 and the surface roughness of interfaces therebetween can also be improved. Consequently, the surface roughness of the interfaces between the first magnetic layer 20 or the second magnetic layer 40 and the insulation layer 30 can be improved. When the surface roughness of the interface between the first magnetic layer 20 or the interface between the second magnetic layer 40 and the insulation layer 30 is improved, scattering of electrons having spins generated at the interfaces can be greatly suppressed. Therefore, degradation in the magneto-resistance characteristic of the magneto-resistance element can be prevented, and the magneto-resistance element having a more disproportional magneto-resistance ratio can be implemented.

The magneto-resistance element in accordance with an exemplary embodiment of the present invention can be applied to an MRAM, including a memory cell configured with an MTJ element and a selection transistor (e.g., MOS-FET). When the MTJ element is formed using the magneto-resistance element in accordance with an exemplary embodiment of the present invention, the MTJ element can have a more disproportional magneto-resistance ratio. In particular, a spin transfer torque (STT) MRAM can suppress scattering of electrons generated at the interface between the free magnetic layer or the pinned magnetic layer and the insulation layer, when electric current flows through the magneto-resistance element. Therefore, the magneto-resistance ratio of the magneto-resistance element is greatly improved, thereby implementing an MRAM having an improved reliability.

In accordance with an exemplary embodiment of the present invention, since the underlying layer of the magneto-resistance element is formed using a new material containing a transition metal, the magneto-resistance ratio of the magneto-resistance element can be greatly improved. Thus, the reliability of the MRAM using the magneto-resistance element can be further improved.

In particular, the magneto-resistance element in accordance with an exemplary embodiment of the present invention can be applied in various industrial fields using magneto-resistance, for example, MRAMs, sensors which read data from magneto-resistance, and so on.

While the present invention has been described with respect to the specific embodiments, it will be apparent to those skilled in the art that various changes and modifications may be made without departing from the spirit and scope of the invention as defined in the following claims.

What is claimed is:

1. A magneto-resistance element comprising:
    an underlying layer including an alloy with a main metal selected from electrically conductive metals and an auxiliary metal selected from transition metals;
    a first magnetic layer stacked on the underlying layer;
    an insulation layer stacked on the first magnetic layer; and
    a second magnetic layer stacked on the insulation layer.

2. The magneto-resistance element of claim 1, wherein the first and second magnetic layers are ferromagnetic layers including at least one material selected from the group consisting of NiFe, Co, Fe, Ni, CoFe, CoFeB, and CoFeSiB.

3. The magneto-resistance element of claim 1, wherein the insulation layer includes at least one material selected from the group consisting of TiO, CuO, NiO, CoO, MgO, TiAlO, ZrAlO, $HfO_2$, AlO, $Ga_2O_3$, TaO, EuO, EuS, $Fe_2O_3$, and ZrO.

4. The magneto-resistance element of claim 3, wherein the insulation layer has a lower electrical conductivity than the first and second magnetic layers.

5. The magneto-resistance element of claim 1, wherein the insulation layer includes an oxygen-containing metallic or nonmetallic compound.

6. The magneto-resistance element of claim 1, wherein the first magnetic layer is a synthetic anti-ferromagnet (SAF) layer, which includes two ferromagnetic layers and a non-magnetic layer disposed between the two ferromagnetic layers.

7. The magneto-resistance element of claim 1, further comprising an anti-ferromagnetic layer disposed between the underlying layer and the first magnetic layer.

8. The magneto-resistance element of claim 7, wherein the anti-ferromagnetic layer includes at least one material selected from the group consisting of MnFe, MnIr, MnRh, PtMn, and Ru.

9. The magneto-resistance element of claim 1, further comprising a capping layer stacked on the second magnetic layer.

10. The magneto-resistance element of claim 1, wherein the auxiliary metal has a smaller atomic size than the main metal.

11. The magneto-resistance element of claim 1, wherein the auxiliary metal has an atomic percent of 50% or less with respect to the main metal.

12. The magneto-resistance element of claim 1, wherein the main metal includes at least one material selected from the group consisting of Al, Cu, and W.

13. The magneto-resistance element of claim 1, wherein the auxiliary metal includes at least one material selected from the group consisting of Ti, Fe, Co, Zr, Ni, Nb, Ru, Ag, Ta, Pt, and Au.

14. A magnetic random access memory (MRAM) comprising:
    a memory cell configured with a magnetic tunnel junction (MTJ) element and a selection transistor, wherein the MTJ element includes:
    an underlying layer including an alloy with a main metal selected from electrically conductive metals and an auxiliary metal selected from transition metals;
    a first magnetic layer stacked on the underlying layer;
    an insulation layer stacked on the first magnetic layer; and
    a second magnetic layer stacked on the insulation layer.

15. The MRAM of claim 14, wherein the auxiliary metal has a smaller atomic size than the main metal.

16. The MRAM of claim 14, wherein the auxiliary metal has an atomic percent of 50% or less with respect to the main metal.

17. The MRAM of claim 14, wherein the main metal includes at least one material selected from the group consisting of Al, Cu, and W.

18. The MRAM of claim 14, wherein the auxiliary metal includes at least one material selected from the group consisting of Ti, Fe, Co, Zr, Ni, Nb, Rh, Ag, Ta, Pt, and Au.

19. A magneto-resistance element comprising:
    an underlying layer including an alloy with a main metal selected from electrically conductive metals and an auxiliary metal selected from transition metals;
    an anti-ferromagnetic layer arranged on the underlying layer;
    a first magnetic layer arranged on the anti-ferromagnetic layer;
    an insulation layer arranged on the first magnetic layer;

a second magnetic layer arranged on the insulation layer; and a capping layer arranged on the second magnetic layer.

20. The magneto-resistance element of claim 19 wherein the main metal includes at least one material selected from the group consisting of Al, Cu, and W and the auxiliary metal includes at least one material selected from the group consisting of Ti, Fe, Co, Zr, Ni, Nb, Ru, Ag, Ta, Pt, and Au.

21. A method of fabricating a magneto-resistance element, comprising:

forming an underlying layer including an alloy with a main metal selected from electrically conductive metals and an auxiliary metal selected from transition metals;

forming a first magnetic layer stacked on the underlying layer;

forming an insulation layer stacked on the first magnetic layer; and forming a second magnetic layer stacked on the insulation layer.

* * * * *